US008786075B1

(12) United States Patent  
Miks et al.

(10) Patent No.: US 8,786,075 B1  
(45) Date of Patent: Jul. 22, 2014

(54) ELECTRICAL CIRCUIT WITH COMPONENT-ACCOMMODATING LID

(75) Inventors: Jeffery Alan Miks, Chandler, AZ (US); John McCormick, Chandler, AZ (US)

(73) Assignee: Amkor Technology, Inc.

( * ) Notice: Subject to any disclaimer, the term of this patent is extended or adjusted under 35 U.S.C. 154(b) by 120 days.

(21) Appl. No.: 13/458,353

(22) Filed: Apr. 27, 2012

(51) Int. Cl.
*H01L 23/12* (2006.01)

(52) U.S. Cl.
USPC .................................. 257/704; 257/E23.181

(58) Field of Classification Search
USPC ............................... 257/680, E23.11, E23.18
See application file for complete search history.

(56) References Cited

U.S. PATENT DOCUMENTS

| 5,909,057 | A | 6/1999 | McCormick |
| 6,043,560 | A * | 3/2000 | Haley et al. .................. 257/706 |
| 7,015,577 | B2 | 3/2006 | Wang |
| 7,196,414 | B2 | 3/2007 | Lin et al. |
| 7,211,889 | B2 * | 5/2007 | Shim .............................. 257/711 |
| 7,800,219 | B2 | 9/2010 | Jeon et al. |
| 2006/0249852 | A1 | 11/2006 | Chiu et al. |
| 2008/0296717 | A1* | 12/2008 | Beroz et al. .................. 257/434 |
| 2010/0001410 | A1 | 1/2010 | Kang |

\* cited by examiner

*Primary Examiner* — Chandra Chaudhari

(74) *Attorney, Agent, or Firm* — McAndrews, Held & Malloy, Ltd.

(57) ABSTRACT

An electrical circuit and/or lid therefor that, among other things, efficiently accommodates devices of different respective heights, substantially as shown in and/or described in connection with at least one of the figures, as set forth more completely in the claims.

20 Claims, 3 Drawing Sheets

ELECTRICAL CIRCUIT WITH COMPONENT-ACCOMMODATING LID

CROSS-REFERENCE TO RELATED APPLICATIONS/INCORPORATION BY REFERENCE

[Not Applicable]

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND OF THE INVENTION

Present techniques and/or architectures for accommodating multiple devices having disparate respective heights in a single package are inefficient. Further limitations and disadvantages of conventional and traditional approaches will become apparent to one of skill in the art, through comparison of such approaches with the present invention as set forth in the remainder of the present application with reference to the drawings.

DETAILED DESCRIPTION OF VARIOUS ASPECTS OF THE INVENTION

Various electrical circuits, for example multi-chip modules and system-in-package circuits, may have multiple components coupled to a substrate where such multiple components have substantially different respective heights. To thermally couple such components to a lid (e.g., a heat-dissipating lid), various custom techniques may be utilized, examples of which will now be presented.

In a first example, a custom lid may be formed, where such lid comprises an irregular surface facing the components. In such example, relatively thicker portions of a lid may be formed and positioned above relatively low-profile components, and relatively thinner portions of the lid may be formed and positioned above relatively high-profile components. In such example, respective gaps between the lid and the components may be generally uniform and/or small enough to be effectively filled with thermal interface material.

In a second example, a lid of uniform thickness is utilized and spacers (e.g., silicon spacers) are utilized to reduce the gap between relatively low-profile components and the lid. Such spacers are thermally conductive and help to provide a thermal path between the relatively low-profile components and the lid (e.g., when utilized with a layer of thermal interface material to close any remaining gap between the lid and the relatively low-profile components and spacers).

The previous examples are generally economically inefficient. Accordingly, various aspects of the present invention provide an electrical circuit and/or lid therefor that efficiently accommodates devices of different respective heights (e.g., in a multi-chip module, system-in-package, etc.).

Figure 1:
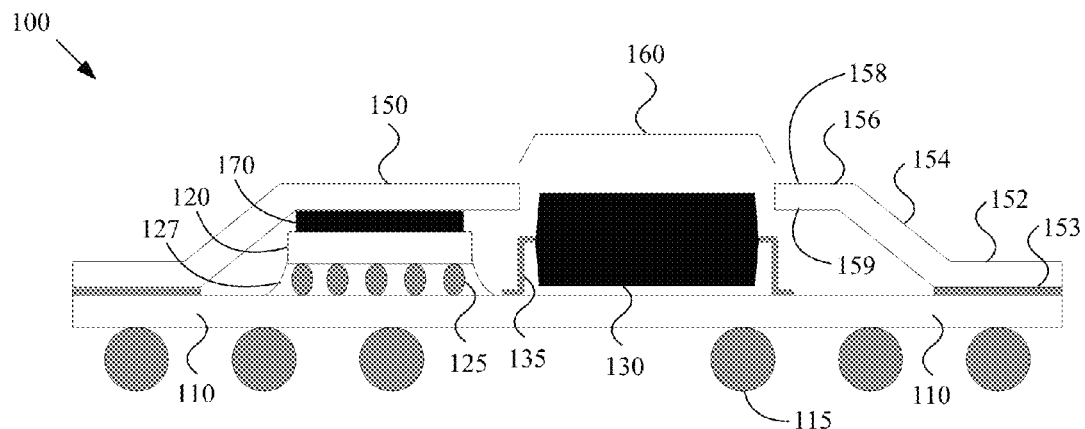
FIG. 1 is a diagram illustrating a side cross-sectional view of an electrical circuit, in accordance with various aspects of the present invention.

Turning first to FIG. 1, such figure is a diagram illustrating a side cross-sectional view of an electrical circuit 100, in accordance with various aspects of the present invention. Many aspects of the exemplary electrical circuit 100 have been selected for illustrative purposes and clarity of discussion. Accordingly, the scope of various aspects of the present invention should not be limited by any particular characteristics of the exemplary electrical circuit 100 unless explicitly claimed.

The electrical circuit 100 comprises a substrate 110. Such substrate 110 may, for example, comprise a multi-chip-module (MCM) package substrate. Such substrate 110 may, for example, comprise characteristics generally associated with Ball Grid Array (BGA) packages. In such an exemplary implementation, as illustrated in FIG. 1, the electrical circuit 100 may comprise a plurality of solder balls 115 (or any of a variety of alternative attachment structures) coupled to the substrate 100. Though the BGA package type is illustrated in FIG. 1, such example is merely illustrative and non-limiting. For example, such substrate 110 may comprise characteristics generally associated with any of a large variety of substrate and/or leaded or leadless package types (e.g., LGA, QFP, DIP, PGA, SO, TSOP, etc.).

The electrical circuit 100 comprises a first electrical component 120 coupled to the substrate 110. Such first electrical component 120 may, by way of example and not limitation, comprise a flip chip component that is coupled to the substrate 110 by way of a plurality of conductive bumps 125 (e.g., solder bumps, gold balls, gold and copper stud bumps, etc.) or, for example, conductive adhesives, etc. Such coupled first electrical component 120 may then be underfilled with any of a variety of different types of underfill 127 (e.g., with an electrically-insulating adhesive).

Though the exemplary first electrical component 120 is illustrated as a flip chip component, such first electrical component 120 can be any of a variety of electrical components. For example and without limitation, the first electrical component 120 may be a wire-bonded die or die stack, a packaged device, any of a variety of active and/or passive electrical devices, etc.

The first electrical component 120 may characterized by a first height (e.g., a first component height, a first height above the substrate 110 when attached to the substrate, etc.).

Note that the first electrical component 120 is presented as being completely covered above by the lid 150. Such illustrative configuration is not limiting. For example, the first electrical component 120 may be at least partially exposed or fully exposed through the window 160 or another opening (e.g., a port) in the lid 150. As a non-limiting example, the first electrical component 120 may comprise a MEMS device, at least a portion of which is exposed via a port in the lid 150. As another example, the first electrical component 120 may comprise an optical device, at least a portion of which is exposed via a port in the lid 150. As an additional example, the lid 150 may comprise any of a variety of holes to enhance manufacturability (e.g., fluid injection) and/or inspectability of the electrical circuit 100.

The electrical circuit 100 comprises a second electrical component 130 coupled to the substrate 110. Such component 130 may, by way of example and not limitation, comprise a leaded or leadless packaged component (e.g., LGA, BGA, FBGA, UBGA, TSOP, etc.). As an example, the second electrical component 130 may be a packaged memory device (e.g., a DDR memory device). The second electrical component 130 may, for example, be coupled to the substrate 110 by soldered or epoxied leads 135 or leadless features, or any of a variety of attachment techniques.

Though the exemplary second electrical component 130 is illustrated as a packaged component, such second electrical component 130 may be of any of a variety of electrical component types. For example and without limitation, the first electrical component 120 may be a flip chip or flip chip stack, wire-bonded die or die stack, any of a variety of active and/or passive electrical devices, etc.

The second electrical component 130 may be characterized by a second height (e.g., a second component height, a second height above the substrate when attached to the substrate 110, etc.).

The second height of the second electrical component 130 may, for example, be substantially greater than the first height of the first electrical component 120. For example, the difference in height between the first electrical component 120 and the second electrical component 130 may be 50 microns or greater. Also for example, the difference in height between the first electrical component 120 and the second electrical component 130 may be 75 microns or greater. Also for example, the difference in height between the first electrical component 120 and the second electrical component 130 may be 100 microns or greater.

The electrical circuit 100 comprises a lid 150. The lid 150 may, for example, be formed (e.g., stamped, milled, molded, etc.) of any of a variety of metallic and/or non-metallic materials. For example, the lid 150 may comprise copper, aluminum, stainless steel, etc. The exemplary lid 150 illustrated in FIG. 1 is a one-piece structure and comprises a plurality of structural portions.

For example, the exemplary lid 150 comprises an attachment portion 152 that is formed (e.g., stamped, milled, molded, etc.) in the lid 150 to enhance attachment to the substrate 110. In the exemplary electrical circuit 100, the attachment portion 152 is attached to the substrate 110 at attachment 153. Such attachment may be performed in any of a variety of manners (e.g., with solder, epoxy, or any of a variety of attachment technologies). Also for example, the exemplary lid 150 comprises a sidewall portion 154 that is formed (e.g., stamped, milled, molded, etc.) in the lid 150 to elevate the primary covering portion 156 of the lid 150 above components to be covered by the lid 150.

Additionally for example, the exemplary lid 150 comprises a primary covering portion 156, the general purpose of which is to cover one or more components of the electrical circuit 100 and to provide for efficient heat dissipation for various components of the electrical circuit 100. The primary covering portion 156 of the lid 150 comprises an upper primary surface 158 (i.e., the surface of the lid 150 generally facing away from the electrical components 120, 130 and substrate 110 of the electrical circuit 100) and a lower primary surface 159 (i.e., the surface of the lid 150 generally facing toward the electrical components 120, 130 and substrate 110 of the electrical circuit 100). The upper primary surface 158 and the lower primary surface 159 of the lid may, for example, be generally parallel with each other and separated by a lid thickness. The lid 150 may, for example, be of uniform thickness. For example, the lid 150 may be formed by stamping and/or cutting the lid 150 from a single piece of uniform material (e.g., a metal sheet).

In the exemplary electrical circuit 100 illustrated in FIG. 1, there is a height disparity between the top of the first electrical component 120 and the lower primary surface 159 of the lid 150, resulting in a gap. Such a gap may, for example, be 50 microns+/−25 microns. The gap may, for example, be filled with a layer of Thermal Interface Material (TIM) 170. Such a TIM layer 170 provides an efficient heat-conductive path between the first electrical component 120 and the lid 150.

The lid 150 comprises a window 160 extending through the lid 150 (i.e., extending between the upper primary surface 158 of the lid 150 and the lower primary surface 159 of the lid 150). The window 160 thus occupies a three-dimensional space in the lid 150 defined by the window opening area and the thickness of the lid 150. The window 160 may, for example, be formed in any of a variety of manners (e.g., stamping, punching, milling, cutting, molding, etc.).

The window 160 is sized and located in the lid 150 so that when the second electrical component 130 and the lid 150 are in their proper respective positions, the second electrical component 130 (e.g., an upper portion thereof) extends into the window 160 (i.e., into the three-dimensional space in the lid 150 defined by the window opening area and the thickness of the lid 150). In a first example, an upper portion of the second electrical component 130 extends into the window 160 but does not extend all of the way through the window 160. For example, the top of the second electrical component 130 is higher than the lower primary surface 159 of the lid 150 and lower than the upper primary surface 158 of the lid 150. In a second example, an upper portion of the second electrical component 130 extends into the window and a top portion of the second electrical component 130 extends through the window. For example, the top of the second electrical component 130 is higher than the upper primary surface 158 of the lid 150.

The window 160 may, for example, be sized a particular amount larger than the outline of the second electrical component 130 (or portion thereof) that will extend into the window 160. Such a particular amount may, for example, be determined based at least in part on various component and/or manufacturing process characteristics. For example, such a particular amount may be determined based at least in part on one or more tolerance values (e.g., component dimensional tolerance, component placement tolerance, window formation tolerance, lid placement tolerance, etc.). Also for example, such a particular amount may be determined based at least in part on one or more statistical values (e.g., component dimensional statistics, component placement statistics, window placement statistics, lid placement statistics, etc.), where such statistical values may, for example, comprise statistical average, mean, variance and/or standard deviation. Such determination may, for example, be made to achieve a particular level of statistical certainty in the relative positioning between the second electrical component 130 and the window 160. As also illustrated in FIG. 1, there is a gap between the second electrical component 130 and the outline of the window 160 in the lid 150. As will be discussed later, such a gap may be left open or may be filled, for example depending on the make-up of the electrical circuit 100 and/or the intended operating environment for such circuit 100. Additional considerations may, for example, include whether a heat sink or other structure will ultimately be mounted in a manner that covers the window 160, in which case filling such a gap may be less of a concern.

Note that the electrical circuit 100 is illustrated with a single window 160 and a single second electrical component 130 extending into the window 160. Such an exemplary configuration of the electrical circuit 100 is presented for illustrative clarity and is non-limiting, as are all exemplary illustrations presented herein. For example, the electrical circuit 100 may comprise a plurality of windows in the lid 150, and one or more electrical components may extend into each of such a plurality of windows (e.g., a window may have one, two, three, or more components extending into and/or through such a window). Accordingly, unless explicitly claimed, the scope of various aspects of the present invention should not be limited by a particular number of electrical components, a particular number of windows, and/or a particular number of electrical components extending into any particular window.

As mentioned above, FIG. 1 provides a side cross-sectional view of the electrical circuit 100. For additional illustrative clarity, FIG. 2 is a diagram illustrating a top view of the electrical circuit 100 shown in FIG. 1, in accordance with various aspects of the present invention.

Figure 2:
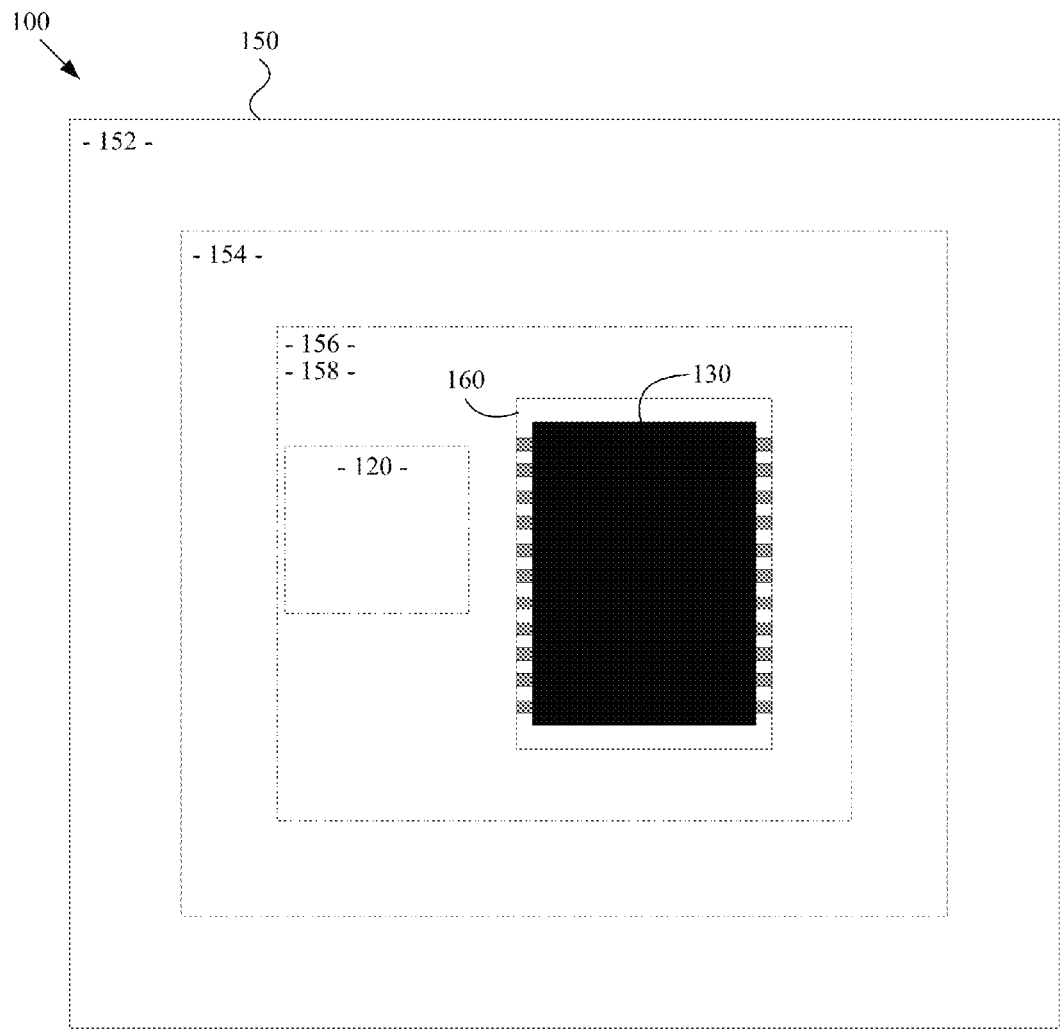
FIG. 2 is a diagram illustrating a top view of the electrical circuit shown in FIG. 1, in accordance with various aspects of the present invention.

In particular, FIG. 2 shows the first electrical component 120 with a dashed line since the first electrical component 120 is covered by the lid 150 in the top view. Additionally, FIG. 2 shows the second electrical component 130. Note that the first electrical component 120 is presented as being completely covered above by the lid 150. Such illustrative configuration is not limiting. For example, the first electrical component 120 may be at least partially exposed or fully exposed through the window 160 or other opening in the lid 150. Also note that although the exemplary illustrations only generally discuss the first electrical component 120 and second electrical component 130, the electrical circuits discussed herein may comprise any number of electrical components, which may be fully or partially covered by the lid 150.

Further, FIG. 2 illustrates the lid 150, including the attachment portion 152, the side-wall portion 154, and the primary covering portion 156 (e.g., the upper primary surface 158 thereof). Also illustrated is the window opening area of the window 160 through which the second electrical component 130 is visible. As discussed above, the window opening area and thickness of the lid 150 define the three-dimensional space of the window 160 (e.g., into which the second electrical component 130 may extend).

As discussed above with regard to FIG. 1, FIG. 2 shows a gap between the second electrical component 130 and the outline of the window 160 in the lid 150, where such a gap may be left open or may be filled.

In general, FIGS. 1 and 2 show cross-sectional and top views of a non-limiting exemplary electrical circuit 100 in accordance with various aspects of the present invention. Accordingly, the scope of various aspects of the present invention should not be limited by any characteristics of the exemplary circuit 100 unless explicitly claimed.

Figure 3:
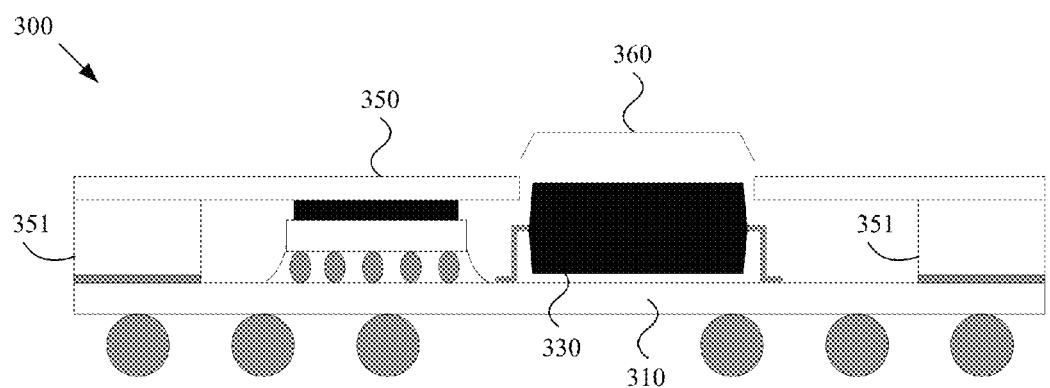
FIG. 3 is a diagram illustrating a side cross-sectional view of an electrical circuit comprising a multi-piece lid, in accordance with various aspects of the present invention.

Turning next to FIG. 3, such figure is a diagram illustrating a side cross-sectional view of an electrical circuit 300 comprising a multi-piece lid, in accordance with various aspects of the present invention. Except for differences discussed herein, the electrical circuit 300 may share any or all characteristics with the exemplary electrical circuit 100 illustrated in FIGS. 1 and 2 and discussed previously.

As discussed previously, the exemplary electrical circuit 100 illustrated in FIG. 1 included a one-piece lid 150. Such lid 150, for example, included an attachment portion 152, side-wall portion 154 and primary covering portion 156 formed in the lid 150 (e.g., stamped from a single uniform metal material). The exemplary electrical circuit 300 illustrated in FIG. 3, however, comprises a multi-piece lid structure.

In particular, the electrical circuit 300 comprises a lid support 351 (or sidewall) that supports the lid 350. Such a lid support 351, prior to mounting, is independent of the lid 350. The lid support 351 may, for example, be positioned along the perimeter of the substrate 310 and coupled to the substrate 310 using solder, epoxy, etc. The lid 350 may be positioned and coupled to the lid support 351, for example before or after the lid support is coupled to the substrate 310.

As with the window 160 in the lid 150 of FIG. 1, the window 360 may also be sized and located so that when the second electrical component 330 and the lid 350 are in their proper respective positions, the second electrical component 330 (e.g., an upper portion thereof) extends into the window 360 (i.e., into the three-dimensional space in the lid 350 defined by the window opening area and the thickness of the lid 350) and/or through the window 360.

As also illustrated in FIGS. 1 and 2, there is a gap between the second electrical component 330 and the outline of the window 360 in the lid 350. As will be discussed next, such a gap may be left open or may be filled, for example depending on the make-up of the electrical circuit 300, the intended operating environment for such circuit 300, whether additional components are to be mounted to the lid 350, etc.

Figure 4:
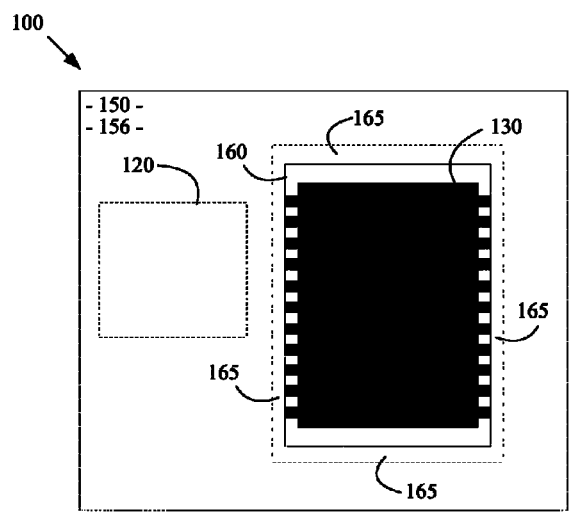
FIG. 4 is a diagram illustrating a top view of the electrical circuit shown in FIGS. 1-2, in accordance with various aspects of the present invention.

Turning next to FIG. 4, such figure is a diagram illustrating a top view of the electrical circuit shown in FIGS. 1-2, in accordance with various aspects of the present invention. The electrical circuit 100 may also, for example, share any or all characteristics with the electrical circuit 300 illustrated in FIG. 3 and discussed previously.

FIG. 4 illustrates the primary covering portion 156 of the lid 150. FIG. 4 shows the first electrical component 120 with a dashed line since the exemplary first electrical component 120 is covered by the lid 150 in the top view. As also illustrated in FIG. 2, FIG. 4 shows the window 160 formed in the lid 150, and the second electrical component 130 that extends into the window 160. FIG. 4 shows a window frame portion 165 of the lid 150 that generally frames the window 160. The width of the window frame portion 165 may be any of a variety of values, for example depending on the nature of features formed thereon.

As discussed above, the gap between second electrical component 130 and the outline of the window 160 may be filled (e.g., with encapsulant, epoxy, and/or any of a variety of materials). Such fill materials may, for example, generally be applied in a fluid form. To enhance the manufacturability and/or quality of the electrical circuit 100, the window frame portion 165 may comprise one or more fluid flow control features. Such fluid flow control features may, for example, assist in directing fluid flow to a particular space and/or confining such fluid to a particular space while such fluid cures. Such fluid flow control features may comprise any of a variety of characteristics, non-limiting examples of which will now be presented with reference to FIG. 5.

Figure 5:
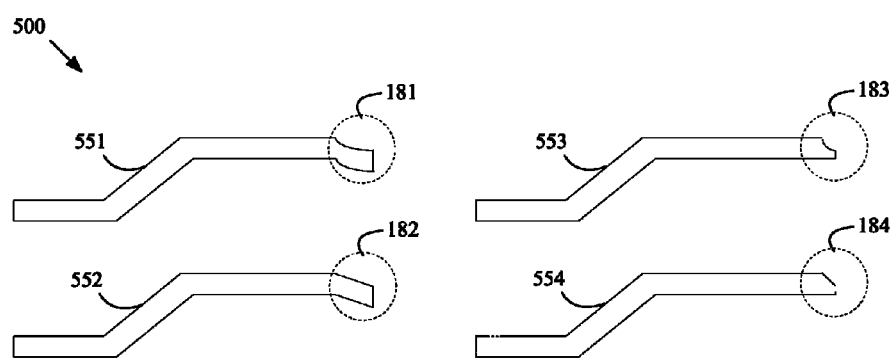
FIG. 5 is a diagram illustrating various fluid flow control features of an electrical circuit lid, in accordance with various aspects of the present invention.

FIG. 5 is a diagram illustrating various fluid flow control features of an electrical circuit lid, in accordance with various aspects of the present invention. As discussed above with regard to FIG. 4, such fluid flow control features may be formed in a window frame portion of a lid (e.g., associated with any of the windows and/or lids discussed herein).

FIG. 5 provides a profile view of a first exemplary lid portion 551 and first exemplary fluid flow control feature 181. FIG. 5 also provides a profile view of a second exemplary lid portion 552 and second exemplary fluid flow control feature 182. FIG. 5 additionally provides a profile view of a third exemplary lid portion 553 and third exemplary fluid flow control feature 183. FIG. 5 further provides a profile view of a fourth exemplary lid portion 554 and fourth exemplary fluid flow control feature 184.

Each of such exemplary fluid flow control features 181-184 is formed to direct fluid flow and/or contain fluid flow in the window around an electrical component in the window. Such features 181-184 may, for example, funnel fluid flow (e.g., into a desired area of the gap or window), block fluid flow (e.g., to contain fluid to a desired area), create a moat or other reservoir of fluid, etc. For example, any one or more fluid flow control features may be formed to control fluid flow during the application of such fluid and/or while such fluid is curing.

The fluid flow control features 181-184 may, for example, be formed on at least a portion of a window frame portion (e.g., the window frame portion 165 illustrated in FIG. 4) or along the entire perimeter of a window frame portion. Such features 181-184 may, for example, be formed by stamping, punching, milling and/or molding the features into the lid. For example, such features 181-184 may be stamped simultaneously with stamping the entire lid or may be stamped in a subsequent operation. For example, a set of generic lids may be stamped to desired standard dimensional characteristics, and then a subset of such lids may be subsequently stamped and/or punched to form windows and/or fluid flow control features as discussed herein.

In general, as discussed above, a window frame portion may be provided with fluid flow control features having any of a variety of characteristics. Accordingly, the scope of various aspects of the present invention should not be limited by any particular characteristics of a fluid flow control feature, nor by the presence or absence of such features, nor by any particular manner of forming such features, unless explicitly claimed.

In summary, various aspects of the present invention provide an electrical circuit and/or lid therefor that, among other things, accommodates devices of different respective heights. While the invention has been described with reference to certain aspects and embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment(s) disclosed, but that the invention will include all embodiments falling within the scope of the appended claims.

What is claimed is:

1. An electrical circuit comprising:
   a substrate;
   an electrical component coupled to the substrate; and
   a lid comprising a window extending through the lid, where the electrical component extends into the window without contacting the lid.

2. The electrical circuit of claim 1, further comprising a second electrical component that is coupled to the substrate and covered by the lid.

3. The electrical circuit of claim 2, wherein the electrical component comprises a packaged semiconductor device that is independently packaged prior to being coupled to the substrate, and the second electrical component comprises a bare die coupled to the substrate.

4. The electrical circuit of claim 3, wherein the electrical component comprises an independently packaged memory device coupled to the substrate, and the second electrical component comprises a flip chip coupled to the substrate.

5. The electrical circuit of claim 1, wherein the electrical component extends into the window but not through the window.

6. The electrical circuit of claim 2, wherein the electrical component is characterized by a first height, and the second electrical component is characterized by a second height greater than the first height by at least 75 microns.

7. The electrical circuit of claim 6, wherein a distance between the second electrical component and the lid covering the second electrical component is less than 75 microns.

8. The electrical circuit of claim 7, further comprising thermal interface material disposed between the second electrical component and the lid.

9. The electrical circuit of claim 1, further comprising encapsulant disposed in the window between the lid and the electrical component.

10. The electrical circuit of claim 1, comprising encapsulant covering the electrical component.

11. The electrical circuit of claim 1, wherein a window frame portion of the lid that frames the window comprises a fluid flow control feature.

12. The electrical circuit of claim 11, wherein the fluid flow control feature comprises a bent portion of the lid controlling fluid flow into a gap between the lid and the electrical component.

13. The electrical circuit of claim 1, wherein the lid has a constant thickness.

14. An electrical circuit comprising:
   a substrate;
   a first electrical component coupled to the substrate, where the first electrical component comprises a semiconductor chip and is characterized by a first height;
   a second electrical component coupled to the substrate, where the second electrical component comprises a semiconductor chip and is characterized by a second height that is greater than the first height by at least 75 microns; and
   a lid comprising a window extending through the lid, where:
      the lid covers the first electrical component; and
      the second electrical component extends into the window but not through the window.

15. The electrical circuit of claim 14, wherein the first electrical component comprises a non-packaged semiconductor chip coupled to the substrate, and the second electrical component comprises a packaged semiconductor device that is independently packaged prior to being coupled to the substrate.

16. The electrical circuit of claim 14, further comprising a heat sink coupled to the lid, where the heat sink is positioned to cover at least a portion of the window.

17. An integrated circuit lid comprising:
   an upper primary surface;
   a lower primary surface parallel to the upper primary surface and separated from the upper primary surface by a lid thickness; and
   a window extending through the lid between the upper primary surface and the lower primary surface, where the window is sized and located in the lid to accommodate a presence of an electrical component within the window without contacting the lid.

18. The integrated circuit lid of claim 17, wherein the window is formed to accommodate the presence of the electrical component within the window but not extending through the window.

19. The integrated circuit lid of claim 17, wherein a window frame portion of the lid that frames the window comprises a fluid flow control feature.

20. The integrated circuit lid of claim 19, wherein the fluid flow control feature comprises a bent portion of the lid controlling fluid flow into a gap between the lid and an electrical component within the window.

\* \* \* \* \*